United States Patent
Park

(10) Patent No.: US 8,856,410 B2
(45) Date of Patent: Oct. 7, 2014

(54) SEMICONDUCTOR MEMORY APPARATUS

(75) Inventor: Nak Kyu Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 473 days.

(21) Appl. No.: 13/219,637

(22) Filed: Aug. 27, 2011

(65) Prior Publication Data

US 2012/0254650 A1  Oct. 4, 2012

(30) Foreign Application Priority Data

Mar. 29, 2011  (KR) .................. 10-2011-0028280

(51) Int. Cl.
| | |
|---|---|
| G06F 13/12 | (2006.01) |
| G06F 1/12 | (2006.01) |
| G11C 7/10 | (2006.01) |
| G11C 7/22 | (2006.01) |

(52) U.S. Cl.
CPC ........ *G11C 7/1012* (2013.01); *G11C 2207/107* (2013.01); *G11C 2207/2272* (2013.01); *G11C 7/222* (2013.01)
USPC .......................................... 710/71; 713/401

(58) Field of Classification Search
None
See application file for complete search history.

(56) References Cited

U.S. PATENT DOCUMENTS

| | | | | |
|---|---|---|---|---|
| 5,963,502 | A | * 10/1999 | Watanabe et al. | 365/233.1 |
| 6,317,372 | B1 | * 11/2001 | Hayashi et al. | 365/201 |
| 7,117,381 | B2 | 10/2006 | Kim | |
| 2009/0161455 | A1 | 6/2009 | Ku | |

FOREIGN PATENT DOCUMENTS

| | | |
|---|---|---|
| KR | 1020010090702 A | 10/2001 |
| KR | 1020040063283 A | 7/2004 |
| KR | 1020060121523 A | 11/2006 |
| KR | 1020080030364 A | 4/2008 |

* cited by examiner

*Primary Examiner* — Idriss N Alrobaye
*Assistant Examiner* — Dayton Lewis-Taylor
(74) *Attorney, Agent, or Firm* — William Park & Associates Patent Ltd.

(57) ABSTRACT

A semiconductor memory apparatus includes a synchronized signal generation circuit, a serial-to-parallel data conversion unit and a data storage region. The synchronized signal generation unit outputs one of a data input/output strobe signal and a delay locked clock signal as synchronized signals in response to a control signal in a write operation. The serial-to-parallel data conversion unit converts serial data into parallel data in response to the synchronized signals. The parallel data is stored in the data storage region.

9 Claims, 5 Drawing Sheets

SEMICONDUCTOR MEMORY APPARATUS

CROSS-REFERENCES TO RELATED APPLICATION

The present application claims priority under 35 U.S.C. §119(a) to Korean application number 10-2011-0028280, filed on Mar. 29, 2011, in the Korean Intellectual Property Office, which is incorporated herein by reference in its entirety.

BACKGROUND

1. Technical Field

The present invention relates generally to a semiconductor integrated circuit, and more particularly, to a semiconductor memory apparatus.

2. Related Art

In general, data are inputted and outputted in a semiconductor memory apparatus in synchronization with a clock for storage and retrieval.

With high integration and high speed operation design, the semiconductor memory apparatus is configured to receive a signal for data inputting and outputting (which is referred to as a data input/output strobe signal) besides a general clock (referred to an external clock).

Therefore, in a normal operation, a semiconductor memory apparatus receives the external clock and the data input/output strobe signal to perform the operations for receiving data, storing the data, and outputting the stored data.

A test is performed on such a semiconductor memory apparatus to confirm whether or not data are normally inputted and stored. A plurality of channels are formed between a test equipment and the semiconductor memory apparatus, and the test equipment transmits the testing-related signals to the semiconductor memory apparatus through the channels.

SUMMARY

In an embodiment of the present invention, a semiconductor memory apparatus includes: a synchronized signal generation circuit configured to output a data input/output strobe signal or a delay locked clock signal as synchronized signals in response to a control signal in a write operation; a serial-to-parallel data conversion unit configured to convert serial data into parallel data in response to the synchronized signals; and a data storage region configured to store the parallel data.

In an embodiment of the present invention, a semiconductor memory apparatus includes: a serial-to-parallel data conversion unit configured to convert serial data into parallel data in response to a rising synchronized signal and a falling synchronized signal; a driver configured to drive a data input/output strobe signal and generate a first rising preliminary synchronized signal and a first falling preliminary synchronized signal; a preliminary synchronized signal generation unit configured to output a delay locked clock signal as a second rising preliminary synchronized signal and a second falling preliminary synchronized signal at an enable timing of one of an active signal, a read signal and a write signal in response to a frequency detection signal, a write latency signal, a read latency signal and a control signal; and a data synchronized signal generation unit configured to output the first rising preliminary synchronized signal and the first falling preliminary synchronized signal or the second rising preliminary synchronized signal and the second falling preliminary synchronized signal as the rising synchronized signal and the falling synchronized signal in response to the control signal.

In an embodiment of the present invention, a semiconductor memory apparatus includes: a timing control unit configured to output a delay locked clock signal as a delay locked rising clock signal and a delay locked falling clock signal in a read operation and a write operation; a serial-to-parallel conversion unit configured to convert serial data inputted from an outside into parallel data in response to the delay locked rising clock signal and the delay locked falling clock signal; and a data storage region configured to receive and store the parallel data.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to exemplary embodiments of the present invention will be described below with reference to the accompanying drawings.

Figure 1:
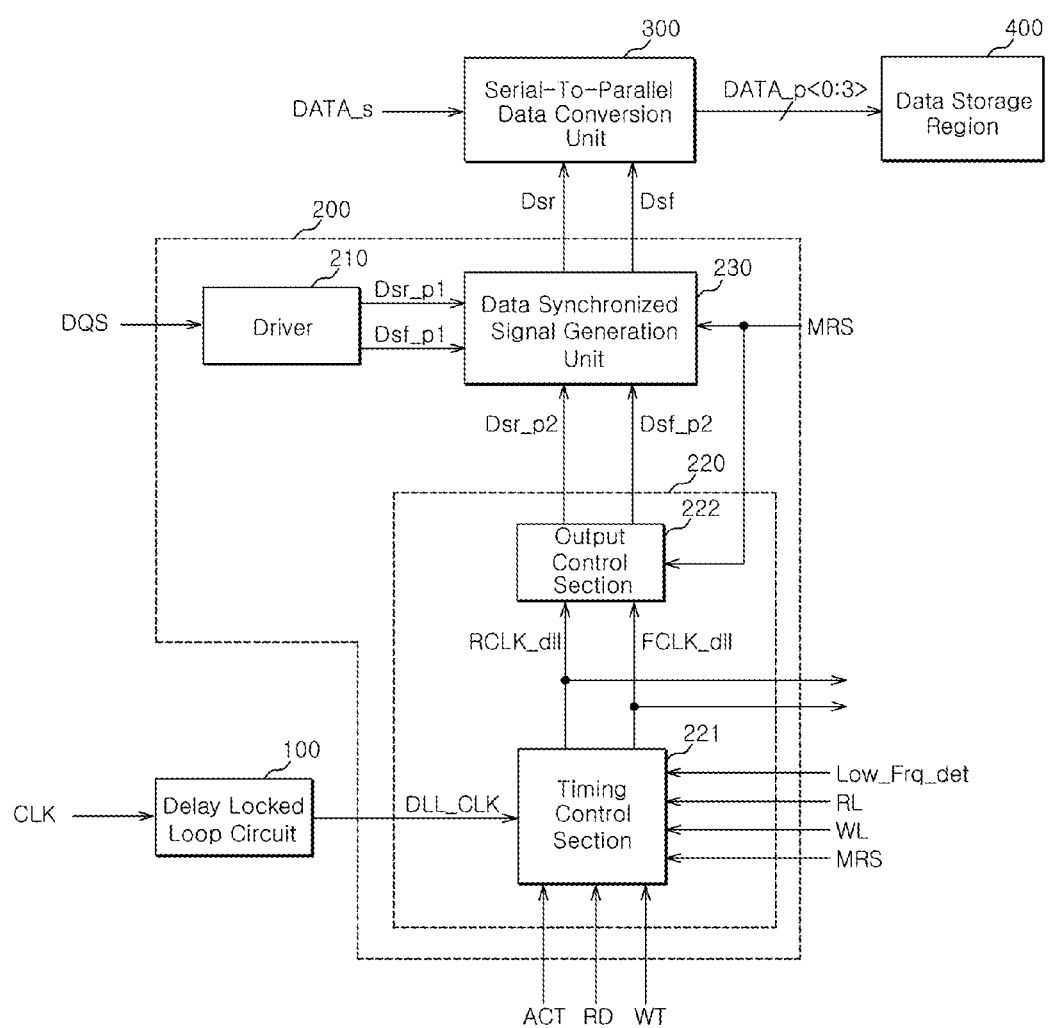
FIG. 1 is a schematic diagram showing a configuration of a semiconductor memory apparatus in accordance with an exemplary embodiment of the present invention.

Referring to FIG. 1, a semiconductor memory apparatus in accordance with an exemplary embodiment of the present invention includes a delay locked loop circuit 100, a synchronized signal generation circuit 200, a serial-to-parallel data conversion unit 300, and a data storage region 400.

The delay locked loop circuit 100 is configured to receive an external clock CLK as an input clock and generate a delay locked clock signal DLL_CLK. The delay locked loop circuit 100 may include a delay locked loop (DLL) circuit, which may be generally known in the art.

The synchronized signal generation circuit 200 is configured to output synchronized signals Dsr and Dsf, where a data input/output strobe signal DQS or the delay locked clock signal DLL_CLK is outputted as the synchronized signals Dsr and Dsf in response to a control signal MRS in a write operation. The control signal MRS is an output signal of a mode register set and represents information preset in the mode register set. Further, the control signal MRS may be a test signal for performing a test or an output signal of a fuse circuit with varying signal level depending on whether a certain fuse is cut or not. In an embodiment of the present invention, the control signal MRS may be described in the context as an output signal of a mode register set; however, it should be readily understood that the scope of the present invention is not limited by it.

The synchronized signal generation circuit 200 includes a driver 210, a preliminary synchronized signal generation unit 220, and a data synchronized signal generation unit 230.

The driver 210 is configured to drive the data input/output strobe signal DQS and generate a first rising preliminary synchronized signal Dsr_p1 and a first falling preliminary synchronized signal Dsf_p1. The phases of the first rising preliminary synchronized signal Dsr_p1 and the first falling preliminary synchronized signal Dsf_p1 are opposite to each other.

The preliminary synchronized signal generation unit 220 is configured to output the delay locked clock signal DLL_CLK as a second rising preliminary synchronized signal Dsr_p2 and a second falling preliminary synchronized signal Dsf_p2, at the enable timing of one of an active signal ACT, a read signal RD and a write signal WT, in response to a frequency detection signal Low_Frq_det, a write latency signal WL, a read latency signal RL, and the control signal MRS. The phases of the second rising preliminary synchronized signal Dsr_p2 and the second falling preliminary synchronized signal Dsf_p2 are opposite to each other.

For example, the preliminary synchronized signal generation unit 220 may output the delay locked clock signal DLL_CLK as the second rising preliminary synchronized signal Dsr_p2 and the second falling preliminary synchronized signal Dsf_p2 at the enable timing of the active signal ACT or the read signal RD in response to the frequency detection signal Low_Frq_det and the read latency signal RL in a read operation. Or, for example, the preliminary synchronized signal generation unit 220 may output the delay locked clock signal DLL_CLK as the second rising preliminary synchronized signal Dsr_p2 and the second falling preliminary synchronized signal Dsf_p2 at the enable timing of either the active signal ACT or the write signal WT, in response to the frequency detection signal Low_Frq_det and the write latency signal WL in a write operation when the control signal MRS is enabled.

The preliminary synchronized signal generation unit 220 includes a timing control section 221 and an output control section 222.

The timing control section 221 is configured to output the delay locked clock signal DLL_CLK as a delay locked rising clock signal RCLK_dll and a delay locked falling clock signal FCLK_dll, at the enable timings of either the active signal ACT or the enable timings of the read signal RD and the write signal WT, in response to the frequency detection signal Low_ Frq_det, the read latency signal RL and the control signal MRS. For example, the timing control section 221 may output the delay locked clock signal DLL_CLK as the delay locked rising clock signal RCLK_dll and the delay locked falling clock signal FCLK_dll at the enable timing of the active signal ACT when the frequency detection signal Low_Frq_det is enabled or the latency value of the read latency signal RL is equal to or greater than a preset latency value. The timing control section 221 outputs the delay locked clock signal DLL_CLK as the delay locked rising clock signal RCLK_dll and the delay locked falling clock signal FCLK_dll, at the enable timing of the read signal RD, and when the frequency detection signal Low_Frq_det is disabled and the latency value of the read latency signal RL is less than the preset latency value. Further, the timing control section 221 outputs the delay locked clock signal DLL_CLK as the delay locked rising clock signal RCLK_dll and the delay locked falling clock signal FCLK_dll, at the enable timing of the active signal ACT, and when the control signal MRS is enabled and the frequency detection signal Low_Frq_det is enabled or the latency value of the write latency signal WL is equal to or greater than a preset latency value. The timing control section 221 outputs the delay locked clock signal DLL_CLK as the delay locked rising clock signal RCLK_dll and the delay locked falling clock signal FCLK_dll, at the enable timing of the write signal WT, and when the control signal MRS is enabled and the frequency detection signal Low_Frq_det is disabled and the latency value of the write latency signal WL is less than the preset latency value. Also, the timing control section 221 does not provide the delay locked clock signal DLL_CLK as the delay locked rising clock signal RCLK_dll and the delay locked falling clock signal FCLK_dll in the write operation when the control signal MRS is disabled.

Figure 2:
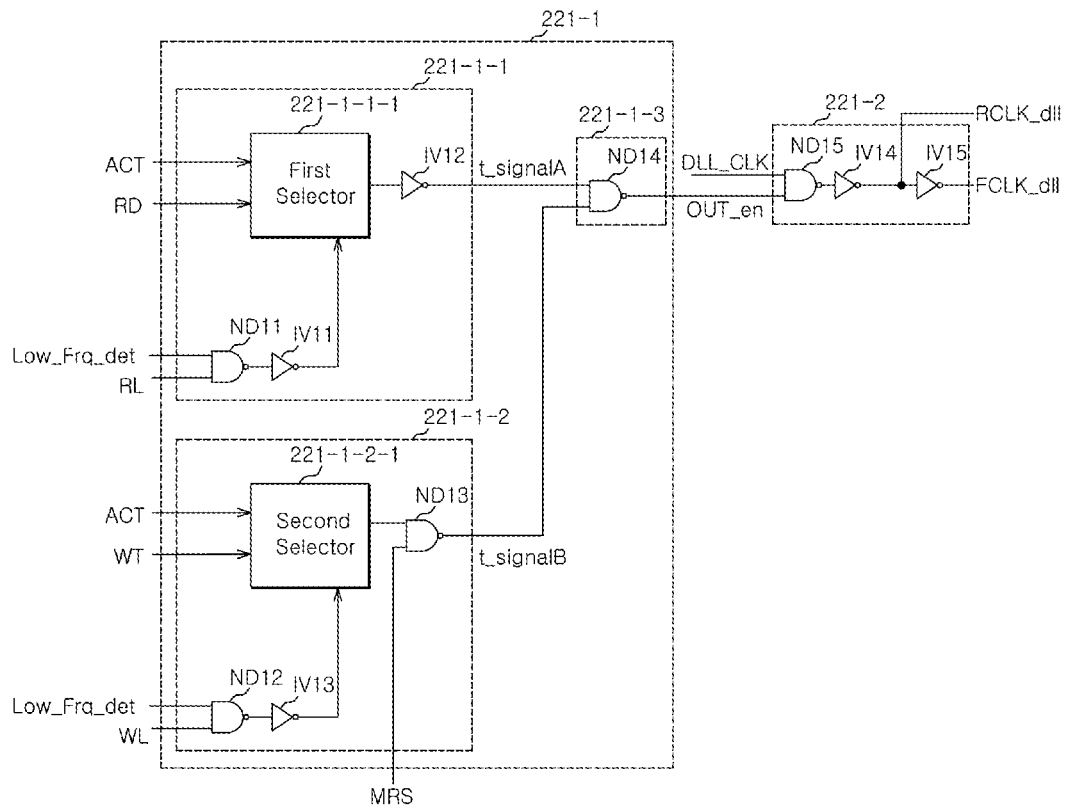
FIG. 2 is a configuration diagram of the timing control section shown in FIG. 1.

Referring to FIG. 2, the timing control section 221 shown in FIG. 1 includes an output enable signal generation part 221-1 and an output part 221-2.

The output enable signal generation part 221-1 is configured to generate an output enable signal OUT_en, which is enabled at the enable timing of the active signal ACT or the enable timings of the read signal RD and the write signal WT, in response to the frequency detection signal Low_Frq_det, the read latency signal RL, the write latency signal WL and the control signal MRS.

The output enable signal generation part 221-1 includes a first signal generation stage 221-1-1, a second signal generation stage 221-1-2, and a signal combination stage 221-1-3.

The first signal generation stage 221-1-1 is configured to output the active signal ACT or the read signal RD as a first timing signal t_signalA in response to the frequency detection signal Low_Frq_det and the read latency signal RL. For example, the first signal generation stage 221-1-1 may output the active signal ACT as the first timing signal t_signalA when the frequency detection signal Low_Frq_det is enabled or the read latency signal RL is enabled, and the first signal generation stage 221-1-1 may output the read signal RD as the first timing signal t_signalA when the frequency detection signal Low_Frq_det is disabled and the read latency signal RL is disabled. The frequency detection signal Low_Frq_det is a signal which is enabled, for example to a low level, when the frequency of the external clock inputted to the semiconductor memory apparatus is equal to or greater than a preset frequency and disabled, for example to a high level, when the frequency of the external clock is less than the preset frequency. The read latency signal RL is a signal which is enabled when a read command is inputted and when a preset number of the external clock cycles has lapsed in the semiconductor memory apparatus. For higher latency value of the read latency signal RL, the preset number of cycles of the external clock increases.

The first signal generation stage 221-1-1 includes a first NAND gate ND11, first and second inverters IV11 and IV12, and a first selector 221-1-1-1. The first NAND gate ND11 receives the frequency detection signal Low_Frq_det and the read latency signal RL. The first inverter IV11 receives the output signal of the first NAND gate ND11. The first selector 221-1-1-1 outputs the active signal ACT when the output signal of the first inverter IV11 is at a predetermined level such as a low level, and outputs the read signal RD when the output signal of the first inverter IV11 is at another predetermined level such as a high level. The first selector 221-1-1-1 may be realized using a multiplexer. The second inverter IV12 receives the output signal of the first selector 221-1-1-1 and outputs the first timing signal t_signalA.

The second signal generation stage 221-1-2 is configured to output the active signal ACT or the write signal WT as a second timing signal t_signalB in response to the frequency detection signal Low_Frq_det and the write latency signal WL when the control signal MRS is enabled. For example, the second signal generation stage 221-1-2 may output the active signal ACT as the second timing signal t_signalB when the control signal MRS is enabled and when the frequency detection signal Low_Frq_det or the write latency signal WL is enabled, and the second signal generation stage 221-1-2 may output the write signal WT as the second timing signal t_signalB when the frequency detection signal Low_Frq_det is disabled and the write latency signal WL is disabled. The frequency detection signal Low_Frq_det is a signal which is enabled, for example to a low level, when the frequency of the external clock inputted to the semiconductor memory apparatus is equal to or greater than a preset frequency and disabled, for example to a high level, when the frequency of the external clock is less than the preset frequency. The write latency signal WL is a signal which is enabled when a write command is inputted and when a preset number of the external clock clock cycles has lapses in the semiconductor memory apparatus. For higher latency value of the write latency signal WL, the preset number of cycles of the external clock increases.

The second signal generation stage 221-1-2 includes second and third NAND gates ND12 and ND13, a third inverter IV13, and a second selector 221-1-2-1. The second NAND gate ND12 receives the frequency detection signal Low_Frq_det and the write latency signal WL. The third inverter IV13 receives the output signal of the second NAND gate ND12. The second selector 221-1-2-1 outputs the active signal ACT when the output signal of the third inverter IV13 is at a predetermined level such as a low level, and outputs the write signal WT when the output signal of the third inverter IV13 is at another predetermined level such as a high level. The second selector 221-1-2-1 may be realized using a multiplexer. The third NAND gate ND13 receives the output signal of the second selector 221-1-2-1 and outputs the second timing signal t_signalB when the control signal MRS is enabled to a high level. Further, the third NAND gate ND13 locks the second timing signal t_signalB to a predetermined level such as a low level when the control signal MRS is disabled to a predetermined level such as a low level.

The signal combination stage 221-1-3 is configured to generate the output enable signal OUT_en which is enabled to, for example, a high level, when even any one of the first timing signal t_signalA and the second timing signal t_signalB is enabled to, for example, a low level.

The signal combination stage 221-1-3 includes a fourth ND gate ND14. The fourth ND gate ND14 receives the first and second timing signals t_signalA and t_signalB and outputs the output enable signal OUT_en.

The output part 221-2 is configured to output the delay locked clock signal DLL_CLK as the delay locked rising clock signal RCLK_dll and the delay locked falling clock signal FCLK_dll when the output enable signal OUT_en is enabled to, for example, a high level, and lock the delay locked rising clock signal RCLK_dll to, for example, a low level and the delay locked falling clock signal FCLK_dll to, for example, a high level when the output enable signal OUT_en is disabled to, for example, a low level.

The output part 221-2 includes a fifth NAND gate ND15, and fourth and fifth inverters IV14 and IV15. The fifth NAND gate ND15 receives the delay locked clock signal DLL_CLK and the output enable signal OUT_en. The fourth inverter IV14 receives the output signal of the fifth NAND gate ND15 and outputs the delay locked rising clock signal RCLK_dll. The fifth inverter IV15 receives the output signal of the fourth inverter IV14 and outputs the delay locked falling clock signal FCLK_dll.

Now referring back to FIG. 1, the output control section 222 is configured to output the delay locked rising clock signal RCLK_dll and the delay locked falling clock signal FCLK_dll as the second rising preliminary synchronized signal Dsr_p2 and the second falling preliminary synchronized signal Dsf_p2, respectively, when the control signal MRS is enabled to, for example, a high level, and lock the second rising preliminary synchronized signal Dsr_p2 and the second falling preliminary synchronized signal Dsf_p2 to a specific level, for example, a low level when the control signal MRS is disabled to, for example, a low level.

Figure 3:
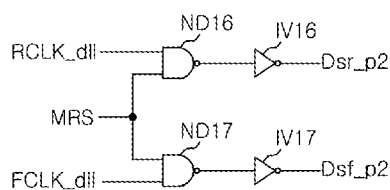
FIG. 3 is a configuration diagram of the output control section shown in FIG. 1.

Referring to FIG. 3, the output control section 222 includes sixth and seventh NAND gates ND16 and ND17, and sixth and seventh inverters IV16 and IV17. The sixth NAND gate ND16 receives the delay locked rising clock signal RCLK_dll and the control signal MRS. The seventh NAND gate ND17 receives the delay locked falling clock signal FCLK_dll and the control signal MRS. The sixth inverter IV16 receives the output signal of the sixth NAND gate ND16 and outputs the second rising preliminary synchronized signal Dsr_p2. The seventh inverter IV17 receives the output signal of the seventh NAND gate ND17 and outputs the second falling preliminary synchronized signal Dsf_p2.

Referring back to FIG. 1, the data synchronized signal generation unit 230 is configured to output the first rising preliminary synchronized signal Dsr_p1 and the first falling preliminary synchronized signal Dsf_p1 or the second rising preliminary synchronized signal Dsr_p2 and the second falling preliminary synchronized signal Dsf_p2 as the rising synchronized signal Dsr and the falling synchronized signal Dsf in response to the control signal MRS. For example, the data synchronized signal generation unit 230 may output the first rising preliminary synchronized signal Dsr_p1 as the rising synchronized signal Dsr and the first falling preliminary synchronized signal Dsf_p1 as the falling synchronized signal Dsf when the control signal MRS is disabled. Further, the data synchronized signal generation unit 230 may output the second rising preliminary synchronized signal Dsr_p2 as the rising synchronized signal Dsr and the second falling preliminary synchronized signal Dsf_p2 as the falling synchronized signal Dsf when the control signal MRS is enabled.

Figure 4:
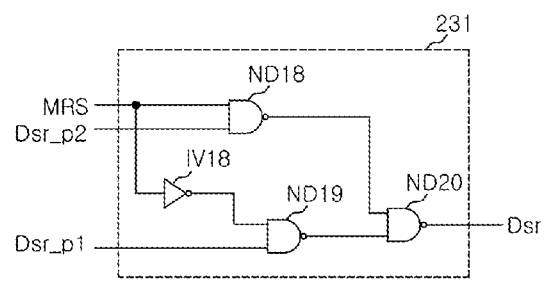
FIG. 4 is a configuration diagram of the data synchronization signal generation unit shown in FIG. 1.
Figure 4:
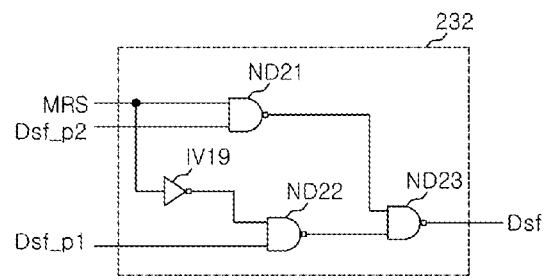

Referring to FIG. 4, the data synchronized signal generation unit 230 includes a rising synchronized signal generating section 231 and a falling synchronized signal generating section 232.

The rising synchronized signal generating section 231 is configured to output the first rising preliminary synchronized signal Dsr_p1 as the rising synchronized signal Dsr when the control signal MRS is disabled, and output the second rising preliminary synchronized signal Dsr_p2 as the rising synchronized signal Dsr when the control signal MRS is enabled.

The rising synchronized signal generating section 231 includes eighth to tenth NAND gates ND18, ND19 and ND20, and an eighth inverter IV18. The eighth NAND gate ND18 receives the control signal MRS and the second rising preliminary synchronized signal Dsr_p2. The eighth inverter IV18 receives the control signal MRS. The ninth NAND gate ND19 receives the first rising preliminary synchronized signal Dsr_p1 and the output signal of the eighth inverter IV18. The tenth NAND gate ND20 receives the output signals of the eighth and ninth NAND gates ND18 and ND19 and outputs the rising synchronized signal Dsr.

The falling synchronized signal generating section 232 is configured to output the first falling preliminary synchronized signal Dsf_p1 as the falling synchronized signal Dsf when the control signal MRS is disabled, and output the second falling preliminary synchronized signal Dsf_p2 as the falling synchronized signal Dsf when the control signal MRS is enabled.

The falling synchronized signal generating section 232 includes eleventh to thirteenth NAND gates ND21, ND22 and ND23, and a ninth inverter IV19. The eleventh NAND gate ND21 receives the control signal MRS and the second falling preliminary synchronized signal Dsf_p2. The ninth inverter IV19 receives the control signal MRS. The twelfth NAND gate ND22 receives the first falling preliminary synchronized signal Dsf_p1 and the output signal of the ninth inverter IV19. The thirteenth NAND gate ND23 receives the output signals of the eleventh and twelfth NAND gates ND21 and ND22 and outputs the falling synchronized signal Dsf.

Figure 5:
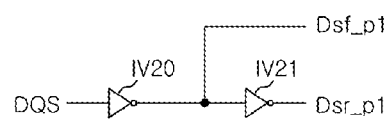
FIG. 5 is a configuration diagram of the driver shown in FIG. 1.

Referring to FIG. 5, the driver 210 shown in FIG. 1 may include tenth and eleventh inverters IV20 and IV21. The tenth inverter IV20 receives the data input/output strobe signal DQS and outputs the first falling preliminary synchronized signal Dsf_p1. The eleventh inverter IV21 receives the output signal of the tenth inverter IV20 and outputs the first rising preliminary synchronized signal Dsr_p1.

Figure 6:
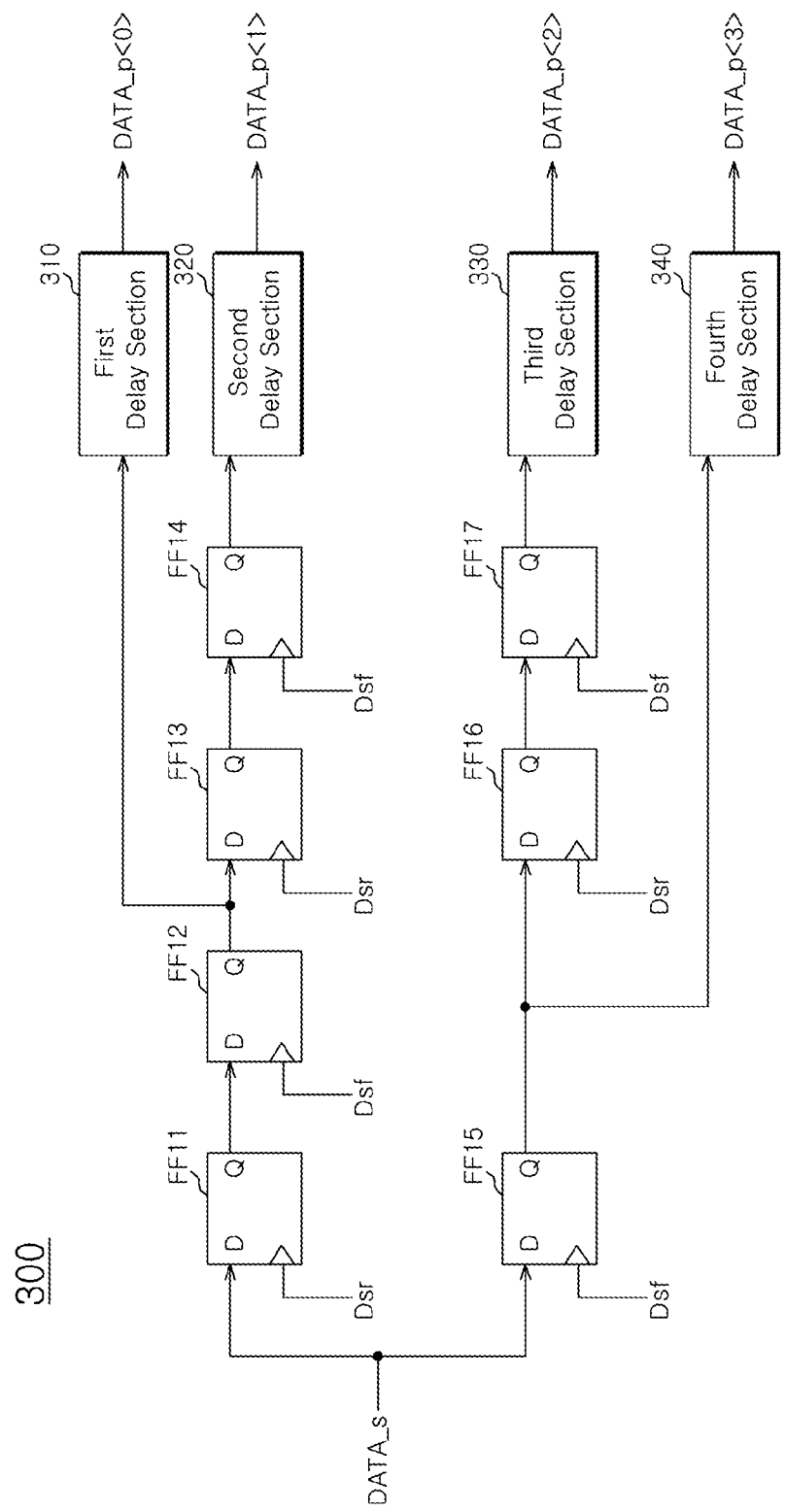
FIG. 6 is a configuration diagram of the serial-to-parallel data conversion unit shown in FIG. 1.

Referring to FIG. 6, the serial-to-parallel data conversion unit 300 shown in FIG. 1 may include first to seventh flip-flops FF11 to FF17, and first to fourth delay sections 310 to 340. The first to fourth flip-flops FF11 to FF14 are connected in series. The fifth to seventh flip-flops FF15 to FF17 are connected in series. In detail, the first flip-flop FF11 receives, stores and outputs serial data DATA_s in response to the rising synchronized signal Dsr. The second flip-flop FF12 receives, stores, and outputs the output signal of the first flip-flop FF11 in response to the falling synchronized signal Dsf. The third flip-flop FF13 receives, stores and outputs the output signal of the second flip-flop FF12 in response to the rising synchronized signal Dsr. The fourth flip-flop FF14 receives, stores and outputs the output signal of the third flip-flop FF13 in response to the falling synchronized signal Dsf. The fifth flip-flop FF15 receives, stores and outputs the serial data DATA_s in response to the falling synchronized signal Dsf. The sixth flip-flop FF16 receives, stores and outputs the output signal of the fifth flip-flop FF15 in response to the rising synchronized signal Dsr. The seventh flip-flop FF17 receives, stores and outputs the output signal of the sixth flip-flop FF16 in response to the falling synchronized signal Dsf. The first delay section 310 is configured to delay the output signal of the second flip-flop FF12 and output parallel data DATA_p<0>. The second delay section 320 is configured to delay the output signal of the fourth flip-flop FF14 and output parallel data DATA_p<1>. The third delay section 330 is configured to delay the output signal of the seventh flip-flop FF17 and output parallel data DATA_p<2>. The fourth delay section 340 is configured to delay the output signal of the fifth flip-flop FF15 and output parallel data DATA_p<3>. The respective delay values of the first to fourth delay sections 310 to 340 are determined such that the respective bits of the parallel data DATA_p<0:3> are simultaneously outputted.

The semiconductor memory apparatus according to an embodiment of the present invention, configured as mentioned above, operates as described below.

In order to set an operation mode of the semiconductor memory apparatus, the control signal MRS is set to a predetermined level such as a high level or a low level in the mode register set. The setting of the control signal MRS to a high level, for example, may mean that a mode for converting the serial data DATA_s into the parallel data DATA_p<0:3> using the delay locked clock signal DLL_CLK is set.

In detail, the delay locked loop circuit 100 generates the delay locked clock signal DLL_CLK.

The timing control section 221 determines the timing at which the delay locked clock signal DLL_CLK is outputted as the delay locked rising clock signal RCLK_dll and the delay locked falling clock signal FCLK_dll. In a read operation, the timing control section 221 determines the timing in response to the frequency detection signal Low_Frq_det and the read latency signal RL such that the delay locked rising clock signal RCLK_dll and the delay locked falling clock signal FCLK_dll are outputted at the enable timing of the active signal ACT or the enable timing of the read signal RD. Also, if the control signal MRS is enabled, in a write operation, the timing control section 221 determines the timing in response to the frequency detection signal Low_Frq_det and the write latency signal WL such that the delay locked rising clock signal RCLK_dll and the delay locked falling clock signal FCLK_dll are outputted at the enable timing of the active signal ACT or the enable timing of the write signal WT. In other words, when the semiconductor memory apparatus receives a clock with a high frequency or when the semiconductor memory apparatus receives a read or write command and a read or write operation faster than a preset time is required, the delay locked rising clock signal RCLK_dll and the delay locked falling clock signal FCLK_dll are outputted at the enable timing of the active signal ACT.

Since the control signal MRS has a high level, the output control section 222 outputs the delay locked rising clock signal RCLK_dll and the delay locked falling clock signal FCLK_dll as the second rising preliminary synchronized signal Dsr_p2 and the second falling preliminary synchronized signal Dsf_p2. Also, the data synchronized signal generation unit 230 provides the second rising preliminary synchronized signal Dsr_p2 and the second falling preliminary synchronized signal Dsf_p2 among the first rising preliminary synchronized signal Dsr_p1 and the first falling preliminary synchronized signal Dsf_p1 and the second rising preliminary synchronized signal Dsr_p2 and the second falling preliminary synchronized signal Dsf_p2 to the serial-to-parallel data conversion unit 300 as the rising synchronized signal Dsr and the falling synchronized signal Dsf.

The serial-to-parallel data conversion unit 300 converts the serial data DATA_s into the parallel data DATA_p<0:3> in response to the rising synchronized signal Dsr and the falling synchronized signal Dsf.

The parallel data DATA_p<0:3> is stored in the data storage region 400.

If the control signal MRS has, for example, a low level, the output control section 222 outputs the second rising preliminary synchronized signal Dsr_p2 and the second falling preliminary synchronized signal Dsf_p2 which are locked to a low level.

The data synchronized signal generation unit 230 provides the first rising preliminary synchronized signal Dsr_p1 and the first falling preliminary synchronized signal Dsf_p1 among the first rising preliminary synchronized signal Dsr_p1 and the first falling preliminary synchronized signal Dsf_p1 and the second rising preliminary synchronized signal Dsr_p2 and the second falling preliminary synchronized signal Dsf_p2 to the serial-to-parallel data conversion unit 300 as the rising synchronized signal Dsr and the falling synchronized signal Dsf. The first rising preliminary synchronized signal Dsr_p1 and the first falling preliminary synchronized signal Dsf_p1 are generated from the data input/output strobe signal DQS which is inputted from an outside.

The serial-to-parallel data conversion unit 300 converts the serial data DATA_s into the parallel data DATA_p<0:3> in response to the rising synchronized signal Dsr and the falling synchronized signal Dsf.

As a result, when the control signal MRS is, for example, at a high level, the serial data DATA_s is converted into the parallel data DATA_p<0:3> using the delay locked clock signal DLL_CLK, and when the control signal MRS is, for example, at a low level, the serial data DATA_s is converted into the parallel data DATA_p<0:3>.

In the semiconductor memory apparatus in accordance with an embodiment of the present invention, in a write operation (i.e., receiving and storing data from outside), the data input/output strobe signal DQS inputted from the outside may be used, and the delay locked clock signal DLL_CLK generated in the semiconductor memory apparatus may also be used.

Therefore, in a test or in a normal operation excluding a test, the number of pads and pins through which signals are to be inputted from an outside may be decreased or increased using the control signal MRS stored in the mode register set. Also, in a test, data may be inputted and stored at the same speed as in a normal operation by using a decreased number of channels.

The mode register set is a component element in the semiconductor memory apparatus that is capable of setting an operation mode of the semiconductor memory apparatus.

When converting the data inputted in the procedure in which the semiconductor memory apparatus receives data from the outside and store the received data in a data storage region, that is, the serial data DATA_s, into the parallel data DATA_p, synchronized signals are used. An embodiment of the present invention is configured such that the type of the synchronized signals used when converting serial data into parallel data may be selected using a mode register set. In an embodiment of the present invention, it is to be noted that, in addition to the mode register set, a test signal and a fuse circuit may be used to set an operation mode of a semiconductor memory apparatus.

Figure 7:
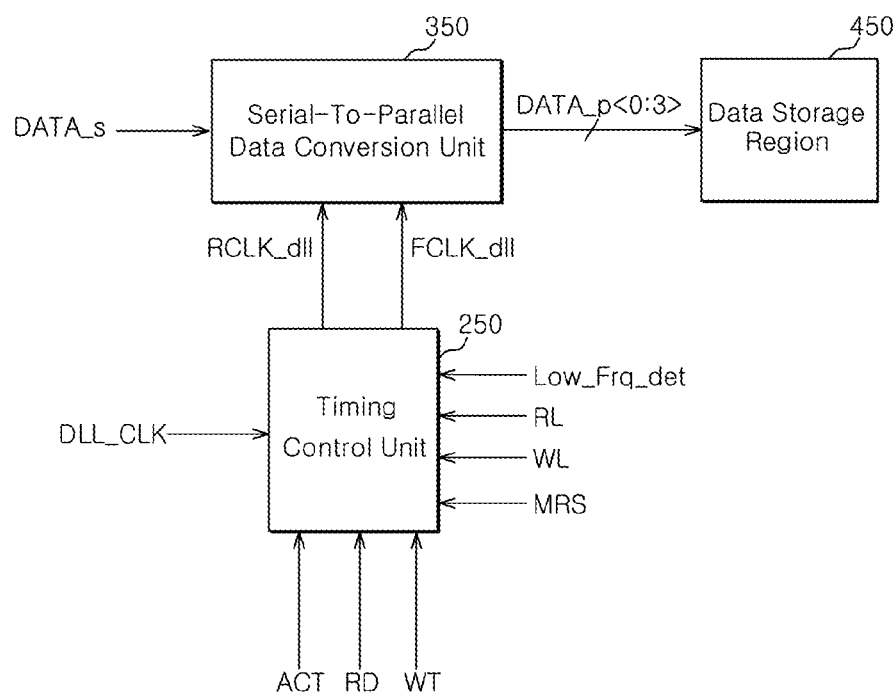
FIG. 7 is a schematic diagram showing the configuration of a semiconductor memory apparatus in accordance with another embodiment of the present invention.

Referring to FIG. 7, a semiconductor memory apparatus in accordance with an embodiment of the present invention may include a timing control unit 250, a serial-to-parallel conversion unit 350, and a data storage region 450.

The timing control unit 250 is configured to output a delay locked clock signal DLL_CLK as a delay locked rising clock signal RCLK_dll and a delay locked falling clock signal FCLK_dll at the enable timing of an active signal ACT in response to a frequency detection signal Low_Frq_det, a read latency signal RL and a control signal MRS, or output the delay locked clock signal DLL_CLK as the delay locked rising clock signal RCLK_dll and the delay locked falling clock signal FCLK_dll at the enable timings of the read signal RD and the write signal WT. That is, the timing control unit 250 controls a timing at which the delay locked clock signal DLL_CLK is outputted as the delay locked rising clock signal RCLK_dll and the delay locked falling clock signal FCLK_dll. The frequency detection signal Low_Frq_det is a signal which includes a result of detecting the frequency of an external clock received by the semiconductor memory apparatus or of the delay locked clock signal DLL_CLK and which is enabled when the external clock or the delay locked clock signal DLL_CLK has a frequency higher than a target frequency.

For example, the timing control unit 250 outputs the delay locked clock signal DLL_CLK as the delay locked rising clock signal RCLK_dll and the delay locked falling clock signal FCLK_dll at the enable timing of the active signal ACT when the frequency detection signal Low_Frq_det is enabled or the latency value of the read latency signal RL is equal to or greater than a preset latency value. The timing control unit 250 outputs the delay locked clock signal DLL_CLK as the delay locked rising clock signal RCLK_dll and the delay locked falling clock signal FCLK_dll at the enable timing of the read signal RD when the frequency detection signal Low_Frq_det is disabled and the latency value of the read latency signal RL is less than the preset latency value. The timing control unit 250 outputs the delay locked clock signal DLL_CLK as the delay locked rising clock signal RCLK_dll and the delay locked falling clock signal FCLK_dll at the enable timing of the active signal ACT when the control signal MRS is enabled and the frequency detection signal Low_Frq_det is enabled or the latency value of the write latency signal WL is equal to or greater than a preset latency value. The timing control unit 250 outputs the delay locked clock signal DLL_CLK as the delay locked rising clock signal RCLK_dll and the delay locked falling clock signal FCLK_dll at the enable timing of the write signal WT when the control signal MRS is enabled and the frequency detection signal Low_Frq_det is disabled and the latency value of the write latency signal WL is less than the preset latency value.

The timing control unit 250 includes an output enable signal generation part 221-1 and an output part 221-2, in the same manner as the timing control section 221 in accordance with the aforementioned embodiment of the present invention shown in FIG. 2. Therefore, detailed descriptions of the output enable signal generation part 221-1 and the output part 221-2 will be omitted herein.

The serial-to-parallel conversion unit 350 is configured to convert serial data DATA_s into parallel data DATA_p<0:3> in response to the delay locked rising clock signal RCLK_dll and the delay locked falling clock signal FCLK_dll. The serial-to-parallel conversion unit 350 includes first to seventh flip-flops FF11 to FF17 and first to fourth delay sections 310 to 340 as shown in FIG. 6. Since the serial-to-parallel conversion unit 300 in accordance with the aforementioned embodiment of the present invention and the serial-to-parallel conversion unit 350 shown in FIG. 7 are configured in the same manner, detailed descriptions of the serial-to-parallel conversion unit 350 will be omitted herein.

The data storage region 450 is configured to receive and store the parallel data DATA_p<0:3>.

The semiconductor memory apparatus according to the embodiment of the present invention, configured as mentioned above, operates as described below.

In order to set an operation mode of the semiconductor memory apparatus, the control signal MRS is set to a high level or a low level in the mode register set. The setting of the control signal MRS to a high level means that modes for inputting and outputting data using the delay locked clock signal DLL_CLK in both a read operation and a write operation of the semiconductor memory apparatus are set. The delay locked clock signal DLL_CLK is a signal which is generated in a delay locked loop (DLL) circuit.

The timing control unit 250 controls the output timing of the delay locked rising clock signal RCLK_dll and the delay locked falling clock signal FCLK_dll which are provided to the serial-to-parallel data conversion unit 350.

For example, the timing control unit 250 operates such that the delay locked rising clock signal RCLK_dll and the delay locked falling clock signal FCLK_dll are outputted at the enable timing of the active signal ACT or the enable timing of the read signal RD in response to the frequency detection signal Low_Frq_det and the read latency signal RL. Meanwhile, the timing control unit 250 operates such that the delay locked rising clock signal RCLK_dll and the delay locked falling clock signal FCLK_dll are outputted at the enable timing of the active signal ACT or the enable timing of the write signal WT in response to the frequency detection signal Low_Frq_det and the write latency signal WL in a write operation when the control signal MRS is enabled to a high level. In other words, when the semiconductor memory apparatus receives a clock with a high frequency or when the semiconductor memory apparatus receives a read or write command from an outside and a read or write operation faster than a preset time is required, the delay locked rising clock signal RCLK_dll and the delay locked falling clock signal FCLK_dll are outputted at the enable timing of the active signal ACT. Meanwhile, when the semiconductor memory apparatus receives a clock with a low frequency or when the semiconductor memory apparatus receives a read or write command from an outside and a read or write operation slower than a preset time is required, the delay locked rising clock signal RCLK_dll and the delay locked falling clock signal FCLK_dll are outputted at the enable timing of the read signal RD or the write signal WT.

The serial-to-parallel data conversion unit 350 converts the serial data DATA_s into parallel data DATA_p<0:3> in response to the delay locked rising clock signal RCLK_dll and the delay locked falling clock signal FCLK_dll.

The data storage region 450 receives and stores the parallel data DATA_p<0:3>.

In the semiconductor memory apparatus in accordance with another embodiment of the present invention, in a write operation, that is, when serial data inputted from an outside is converted into parallel data, unlike the conventional art in which a data input/output strobe signal is used, a delay locked clock signal as an output signal of a delay locked loop circuit is used. Accordingly, due to the fact that the delay locked clock signal generated in the semiconductor memory apparatus is used instead of the data input/output strobe signal in the write operation, the number of pins through which signals are to be inputted from the outside in the write operation may be decreased, whereby the pin utilization efficiency of the semiconductor memory apparatus may be improved. Also, when receiving and storing data in a test, since a signal used to convert serial data into parallel data is not received from the outside but employs a signal generated in the semiconductor memory apparatus, a decreased number of channels (pins) may be used when compared to the conventional art, and in a test, data may be received and stored at the same speed as in a normal operation.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a serial-to-parallel data conversion unit configured to convert serial data into parallel data in response to a rising synchronized signal and a falling synchronized signal;
a driver configured to drive a data input/output strobe signal and generate a first rising preliminary synchronized signal and a first falling preliminary synchronized signal;
a preliminary synchronized signal generation unit configured to output a second rising preliminary synchronized signal and a second falling preliminary synchronized signal based on a delay locked clock signal at an enable timing of an active signal and a read signal or of the active signal and a write signal in a write operation in response to one or more of a frequency detection signal, a write latency signal, a read latency signal and a control signal; and
a data synchronized signal generation unit configured to output the rising synchronized signal and the falling synchronized signal based on either the first rising and falling preliminary synchronized signals or the second rising or falling preliminary synchronized signals in response to the control signal.

2. The semiconductor memory apparatus according to claim 1, wherein the control signal is a mode register set signal.

3. The semiconductor memory apparatus according to claim 1, wherein the driver receives the data input/output strobe signal and generates the first rising preliminary synchronized signal and the first falling preliminary synchronized signal which have opposite phases to each other.

4. The semiconductor memory apparatus according to claim 1,
wherein the serial-to-parallel data conversion unit comprises a plurality of flip-flops which are connected in series, and
wherein the plurality of flip-flops receive the serial data and output the parallel data in response to the rising synchronized signal or the falling synchronized signal.

5. The semiconductor memory apparatus according to claim 1, wherein the preliminary synchronized signal generation unit outputs the second rising preliminary synchronized signal and the second falling preliminary synchronized signal based on the delay locked clock signal at the enable timing of the active signal or the read signal in response to the frequency detection signal and the read latency signal in the read operation.

6. The semiconductor memory apparatus according to claim 5, wherein the preliminary synchronized signal generation unit outputs the second rising preliminary synchronized signal and the second falling preliminary synchronized signal based on the delay locked clock signal at the enable timing of the active signal or the write signal in response to the frequency detection signal and the write latency signal in the write operation when the control signal is enabled.

7. The semiconductor memory apparatus according to claim 6, wherein the second rising preliminary synchronized signal and the second falling preliminary synchronized signal are out of phase.

8. The semiconductor memory apparatus according to claim 7, wherein the preliminary synchronized signal generation unit comprises:
a timing control section configured to output a delay locked rising clock signal and a delay locked falling clock signal based on the delay locked clock signal at the enable timing of the active signal or the enable timings of the read signal and the write signal in response to one or more of the frequency detection signal, the read latency signal, the write latency signal and the control signal; and
an output control section configured to output the second rising preliminary synchronized signal and the second falling preliminary synchronized signal based on the delay locked rising clock signal and the delay locked falling clock signal as or to lock the second rising preliminary synchronized signal and the second falling preliminary synchronized signal to a specified level, in response to the control signal.

9. The semiconductor memory apparatus according to claim 8, wherein the timing control section comprises:

an output enable signal generation part configured to generate an output enable signal which is enabled at the enable timing of the active signal or the enable timings of the read signal and the write signal, in response to one or more of the frequency detection signal, the read latency signal, the write latency signal and the control signal; and an output part configured to output the delay locked clock signal as the delay locked rising clock signal and the delay locked falling clock signal when the output enable signal is enabled, or to lock each of the delay locked rising clock signal and the delay locked falling clock signal to a specified level when the output enable signal is disabled.

* * * * *